United States Patent [19]

Wojnarowski et al.

[11] Patent Number: 5,104,480
[45] Date of Patent: Apr. 14, 1992

[54] DIRECT PATTERNING OF METALS OVER A THERMALLY INEFFICIENT SURFACE USING A LASER

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 597,255

[22] Filed: Oct. 12, 1990

[51] Int. Cl.[5] .............................. B44C 1/22; C23F 1/02
[52] U.S. Cl. .................................... 156/643; 156/656; 219/121.69
[58] Field of Search ............... 156/643, 646, 656, 664, 156/665, 666, 668; 219/121.68, 121.69, 121.84, 121.85

[56] References Cited

U.S. PATENT DOCUMENTS

| | | | |
|---|---|---|---|
| 3,867,217 | 2/1975 | Maggs et al. | 156/643 |
| 4,037,075 | 7/1977 | Pugsley et al. | 219/121.85 |
| 4,259,433 | 3/1981 | Mizobuchi et al. | 430/296 |
| 4,874,920 | 10/1989 | Yamazaki et al. | 219/121.85 |

Primary Examiner—William A. Powell
Attorney, Agent, or Firm—Marvin Snyder; James C. Davis, Jr.

[57] ABSTRACT

Conductive patterns may be formed on the surface of thermally inefficient substrates by depositing a uniform layer of metal thereover whose upper surface is substantially UV light absorbing followed by laser ablation of the deposited metal to leave the deposited metal only in the desired metal pattern. Thermally efficient substrates may be rendered thermally inefficient by the deposition of a thermally inefficient material thereon. That thermally inefficient material may be either electrically insulating or a metal. A two layer metallization comprising a first, thermally inefficient reactive metal and a second UV light absorbing metal is preferred. When disposed on a thermally inefficient substrate, this two layer metallization ablates reactively as the two layers burn off together. This laser ablation process substantially roughens the surface of polymer dielectrics and may be used to repair open traces in printed circuit structures.

26 Claims, 7 Drawing Sheets

# DIRECT PATTERNING OF METALS OVER A THERMALLY INEFFICIENT SURFACE USING A LASER

BACKGROUND OF THE INVENTION

1. Field of the Invention

The present invention relates to the fields of metal patterning and electronics, and more particularly, to the patterning of thin layers of metal.

2. Background Information

In the electronic arts, a common method of providing a circuit pattern is to form a layer of metal on an electrically insulating substrate, deposit a layer of photoresist over the metal, pattern the photoresist photolithographically and etch the metal where it is not protected by the photoresist in order to leave the metal present in the pattern of the retained photoresist. This etching technique is limited in its inability to maintain very fine line lithography due to photoresist lift-off or deterioration, undercutting and other phenomena during etching.

An alternative technique is to electroplate metal on the portions of the initial metal layer which are not covered by the photoresist. Such a plating process is normally completed by removing the remaining photoresist and etching away the initial metal layer with an etchant which does not attack the electroplated metal. The use of this plating technique to form gold, chrome or nickel electroplated conductors is normally ineffective because the electroplating bath attacks the photoresist vigorously causing deterioration and lift-off of the photoresist which results in plating in areas intended to be kept plating-free.

A high density interconnect (HDI) structure or system which has been developed by General Electric Company requires patterning of metal conductors disposed on dielectric layers in order to form the interconnections among the integrated circuit chips of a system it is being used to interconnect. This high density interconnect structure offers many advantages in the compact assembly of electronic systems. For example, an electronic system such as a micro computer which incorporates 30-50 chips can be fully assembled and interconnected on a single substrate which is 2 inches long by 2 inches wide by 0.050 inch thick.

Briefly, in this high density interconnect structure, a ceramic substrate such as alumina which may be 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® 6000 from the General Electric Company. The various components are then placed in their desired locations within the cavity, the entire structure is heated to about 300° C. which is above the softening point of the ULTEM ® polyetherimide (which is in the vicinity of 235° C.) and then cooled to thermoplastically bond the individual components to the substrate. Thereafter, a polyimide film which may be Kapton ® polyimide, available from E.I. du Pont de Nemours Company, which is =0.0005-0.003 inch (=12.5-75 microns) thick is pretreated to promote adhesion by reactive ion etching (RIE). The substrate and chips are then coated with ULTEM ® 1000 polyetherimide resin or another thermoplastic and the Kapton ® film is laminated across the top of the chips, any other components and the substrate with the ULTEM ® resin serving as a thermoplastic adhesive to hold the Kapton ® in place. Thereafter, via holes are provided (preferably by laser drilling) in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process. Additional dielectric and metallization layers are provided as required in order to provide all of the desired electrical connections among the chips.

Good adhesion of the metal conductors to the underlying dielectric and good adhesion of each dielectric layer to both the underlying metal and the underlying dielectric is necessary for proper fabrication of these high density interconnect circuits.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et.al.; U.S. Pat. No. 4,835,704, entitled "Adaptive Lithography System to Provide High Density Interconnect" by C. W. Eichelberger, et.al.; U.S. Pat. No. 4,714,516, entitled "Method to Produce via Holes in Polymer Dielectrics for Multiple Electronic Circuit Chip Packaging" by C. W. Eichelberger, et.al.; U.S. Pat. No. 4,780,177, entitled "Excimer Laser Patterning of a Novel Resist" by R. J. Wojnarowski et.al.; U.S. Pat. application Ser. No. 07/644,176 filed Jan. 23, 1991, continuation application of U.S. Pat. application Ser. No. 249,927, filed Sept. 27, 1989, entitled "Method and Apparatus for Removing Components Bonded to a Substrate" by R. J. Wojnarowski, now abandoned, et.al.; U.S. Pat. No. 4,894,115 issued Jan. 16, 1990, entitled "Laser Beam Scanning Method for forming via Holes in Polymer Materials" by C. W. Eichelberger et.al.; U.S. Pat. application Ser. No. 07/745,982, filed Aug. 5, 1991, continuation application of U.S. Pat. application Ser. No. 312,798, filed Feb. 21, 1989, entitled "High Density Interconnect Thermoplastic Die Attach Material and Solvent Die Attachment Processing" by R. J. Wojnarowski, now abandoned, et.al.; U.S. Pat. application Ser. No. 283,095, issued Nov. 7, 1989 entitled "Simplified Method for Repair of High Density Interconnect Circuits" by C. W. Eichelberger, et.al.; U.S. Pat. application Ser. No. 07/559,532, filed July 19, 1990, now abandoned, continuation application of U.S. Pat. application Ser. No. 305,314, filed Feb. 3, 1989, entitled "Fabrication Process and Integrated Circuit Test Structure" by H. S.. Cole, now abandoned, et.al.; U.S. Pat. No. 5,019,946 issued May 28, 1991, entitled "High Density Interconnect With High volumetric Efficiency" C. W. Eichelberger, et.al.; U.S. Pat. No. 5,019,535 issued May 28, 1991, entitled "Die Attachment Method for Use in High Density Interconnected Assemblies" by R. J. Wojnarowski, et.al.; U.S. Pat. No. 4,960,613 issued Oct. 2,1990 entitled "Laser Interconnect Process" by H. S. cole, et.al.; U.S. Pat. No. 4,884,122 issued Nov. 28, 1989, entitled "Method and Configuration for Testing Electronic Circuits and Integrated Ciciuit Chips Using a Removable Overlay Layer" by C. W. Eichelberger, et.al.; U.S. Pat. application Ser. No. 233,965, filed Aug. 8, 1988, entitled "direct Deposition of Metal Patterns for Use in Integrated Circuit Devices" by Y. S. Liu, now abandoned; U.S. Pat. No. 4,882,200 issued Nov. 21, 1989, entitled "Method for Photopatterning Metallization Via UV Laser Ablation of the Activator" by Y. S. Liu, et.al.; U.S. Pat. application Ser. No. 237,685, filed Aug. 25, 1988, entitled "Direct Writing of Refractory Metal Lines for Use in Integrated Circuit Devices" by Y. S. Liu, et.al., now abandoned; U.S. Pat. No. 4,983,042 issued June 12, 1990, entitled "Method and Apparatus for Packaging Integrated Circuit Chips Employing a Polymer film Overlay Layer" by C. W. Eichelberger, et.al., U.S. Pat. No. 4,897,153 issued Jan. 30, 1990 entitled "Method of Processing siloxane-Polyimides for Electronic Packaging Applications" by H. S. Cole, et.al.; U.S. Pat. No. 4,988,412 issued Jan. 29, 1991 entitled "Selective Electrolytic Deposition on Conductive and Non-Conductive Substrates" by Y. S. Liu, et. al.; U.S. Pat. application Ser. No. 312,536, filed Feb. 17, 1989, entitled "Method of Bonding a Thermoset Film to a Thermoplastic Material to Form a Bondable Laminate" by R. J. Wojnarowski, now abandoned; U.S. Pat. application Ser. No. 363,646, filed June 8, 1989, entitled "Integrated Circuit Packaging Configuration for Rapid Customized Design and Unique Test Capability" by C. W. Eichelberger, et.al.; U.S. Pat. application Ser. No. 07/459,844, filed Jan. 2, 1990, entitled "Area-Selective Metallization Process" by H. S.. Cole, et.al.; U.S. Pat. No. 5,019,997 issued May 28, 1991, entitled, "Adaptive Lithography Accommodation of Tolerances and Chip Positioning in High Density Interconnect Structures", by T. R. Haller; U.S. Pat. application Ser. No. 07/457,023, filed Dec. 26, 1989, entitled "Locally Orientation Specific Routing System" by T. R. Haller, et.al.; U.S. Pat. application Ser. No. 456,421, filed Dec. 26, 1989, entitled "Laser Abatable Polymer Dielectrics and Methods" by H. S. Cole, et.al.; U.S. Pat. application Ser. No. 454,546, filed Dec. 21, 1989, entitled "Hermetic High Density Interconnected Electronic system" by W. P. Kornrumpf, et.al., U.S. Pat. No. 5,040,047 issued Aug. 13, 1991 entitled "Enchanced Fluorescence Polymers and Interconnect Structures Using Them" by H. S. Cole, et.al.; U.S. Pat. application Ser. No. 07/646,112, filed Jan. 28, 1991, divisional application of U.S. Pat. appliction Ser. No. 454,455, filed Dec. 21, 1989, entitled "An Epoxy/Polyimide Copolymer Blend Dielectric and layered Circuits Incorporating" by C. W. eichelberger, et. al., now abandoned; application Ser. No. 07/504,760, filed Apr. 5, 1990, entitled "A Building Block Approach to Microwave Modules", by W. P. Kornrumpf et.al.; application Ser. No. 07/504,281, filed Apr. 5, 1990, entitled "HDI Microwave Circuit Assembly", by W. P. Kornrumpf, et.al.; application Ser. No. 07/504,750 filed Apr. 5, 1990, entitled "An Ultrasonic Array With a High Density of Electrical Connections", by L. S. Smith, et.al.; application Ser. No. 07/504,383, filed Apr. 5, 1990, entitled, "Microwave Component Test Method and Appartus", by W. P. Kornrumpf, et. al.; application Ser. No. 07/504,753, filed Apr. 5, 1990, entitled, "A Compact High Density Interconnected Microwave System", by W. P. Kornrumpf; application Ser. No. 07/504,769, filed Apr. 5, 1990, entitled, "A Flexible High Density Interconnect Structure and Flexibly Interconnected System" by C. W. Eichelberger, et.al.; application Ser. No. 07/504,751, filed Apr. 5, 1990, entitled, "Compact, Thermally Efficient focal Palen Array and Testing and Repair Thereof", by W. P. Kornrumpf, et.al.; application Ser. No. 07/504,749, filed Apr. 5, 1990, entitled, "High Density Interconnect Structure with Top Mounted Components", by R. J. Wojnarowski, et al.; application Ser. No. 07/504,770, filed Apr. 5, 1990, entitled, "A High Density Interconnect Structure Including a Chamber", by R. J. Wojnarowski, et.al.; application Ser. No. 07/504,748, filed Apr. 5, 1990, entitled, "Microwave Component Having Tailored Operating Characteristics and Method of Tailoring" by W. P. Kornrumpf, et.al.; application Ser. No. 07/546,963, filed July 2, 1990, entitled "Multiple Lamination High Density Interconnect Process and Structure Employing Thermoplastic Adhesives having Sequentially Decreasing Tg's" by H. S. Cole et.al.; application Ser. No. 07/546,964, filed July 2, 1990, entitled "High Temperature Polyether Imide Compositions and Method of Making" by J. H.. Lupinski et.al.; application Ser. No. 07/545,793, filed June 29, 1990, entitled, "Adaptive Lithography in a High Density Interconnect Structure Whose Signal Layers Have Fixed Patterns" by T. R.. Haller et.al.; application Ser. No. 07/546,965, filed July 2, 1990, entitled "A High Density Interconnect Structure Including a Spacer Structure and a Gap", by H. S. Cole et.al.; application Ser. No. 07/546,959, filed July 2, 1990, entitled, "Multiple Lamination High Density Interconnect Process and Structure Employing a Variable Crosslinking Adhesive", by T. B. Gorczyca et.al.; application Ser. No. 07/546,230, filed June 29, 1990, entitled, "Method of Developing a Self-Developing Resist", by H. S. Cole, et.al.; application Ser. No. 07/546,960, filed July 2, 1990, entitled, "Multi-Sublayer Dielectric Layers, by H. S. Cole et.al.; and application Ser. No. 07/548,462, filed July 2, 1990, entitled, "Compact High Density Interconnect Structure", by W. M. Marcinkiewicz et.al. Each of these Patents and Patent applications is incorporated herein by reference.

There is a continuing need for improved metal patterning techniques and for enhanced inter-dielectric layer adhesion.

OBJECTS OF THE INVENTION

Accordingly, a primary object of the present invention is to provide an improved metal patterning technique which enables copper, gold, chrome and nickel patterns to be formed with high definition and reliability.

Another object of the present invention is to provide an improved technique for producing high definition conductor patterns by patterned removal of a uniform conducting layer.

Another object of the present invention is to provide a laser ablation technique for patterning conductive layers.

Another object of the present invention is to provide a metal patterning technique in which two layers of different metals burn off together during laser patterning.

Another object of the present invention is to provide a laser metal patterning technique which is useful on high thermal conductivity substrates.

Another object of the present invention is to provide a technique for repairing open conductors in printed circuit type structures including wafer scale integrated assemblies, high density interconnect structures and so forth.

Another object of the present invention is to provide temporary connections for testing and other purposes in printed circuit type structures including wafer scale integrated assemblies, high density interconnect structures and so forth.

Another object of the present invention is to provide improved adhesion of subsequently deposited dielectric layers to previously deposited dielectric layers by greatly increasing the surface area of the previously deposited dielectric layers.

Another object of the present invention is to provide an improved technique for trimming passive components.

SUMMARY OF THE INVENTION

The above and other objects which will become apparent from the specification as a whole, including the drawings, are accomplished in accordance with the present invention by laser ablation of an ultraviolet light absorbing metal layer to define a metal pattern.

In accordance with one embodiment, a first layer of a thermally inefficient, reactive metal is deposited on an electrically insulating substrate and a second ultraviolet (UV) light absorbing metal is deposited on that first metal. The resulting structure is scanned with a UV laser having sufficient power to ablate the first and second metals together to remove them from the substrate in a pattern which is determined by the scanning pattern of the laser beam, while leaving them on the substrate elsewhere. Where the substrate is a polymer and the first layer is titanium or chrome and the second layer is copper, the portion of the polymer surface from which the metals were ablated is greatly roughened. If a subsequent dielectric layer is formed on top of this roughened surface by applying a liquid precursor and drying or curing it, then adhesion between the two layers is greatly enhanced by a resulting interlocking of the newly deposited dielectric layer with the roughened surface of the substrate.

In accordance with another embodiment, a UV absorbing metal may be deposited directly on a thermally inefficient insulating substrate and laser ablated to provide the desired metal pattern, however, the resulting pattern is not as good.

In accordance with another embodiment, where the substrate is highly thermally conducting, an initial layer of a thermally inefficient metal such as titanium, chrome, stainless steel and so forth is disposed on the substrate prior to deposition of a subsequent layer of UV absorbing metal. This layer of thermally inefficient metal is made thick enough to cause the combined structure to act as a thermally inefficient substrate. The UV absorbing metal is then ablated from the surface of the thermally inefficient metal to create a metal pattern with good definition. The remaining portions of the second metal layer may then be used as a mask for etching those portions of the first metal which were exposed by the ablation of the second metal. Thereafter, the second metal may be retained or removed, as may be desired.

In accordance with another embodiment, a four layer metal structure may be deposited on a thermally conducting substrate with the third layer being thermally inefficient and the fourth layer being UV absorbing. The fourth layer is then patterned by scanning a laser across it. That fourth layer is then used as an etching mask for the third, thermally inefficient layer. The second layer and then the first layer may be etched to provide a conductor pattern of the second layer metal over first layer metal. When the third layer is titanium, the remaining portions of the fourth layer may be removed and additional metal may be electroplated on the exposed portions of the second layer without plating on the titanium.

In accordance with another embodiment, a printed circuit having a break in an intended-to-be-continuous trace is repaired by depositing a thermally inefficient metal over the entire surface, depositing a UV light absorbing metal over the first metal and then ablating the two deposited layers every place where conductors are not desired. The result is a bridging conductor which connects the two pieces of the trace across the unintended gap therein.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
FIGS. 1-5 illustrate a sequence of stages in the production of a metal pattern in accordance with one embodiment of the invention.

In FIG. 1, an electrically insulating substrate 10 is shown in cross-section view. It is desired to form a conductor pattern on the upper surface of this substrate. This substrate may be glass, polymer materials or other relatively thermally inefficient materials. By thermally inefficient, we mean that the material is relatively slow to dissipate localized heat. In this sense, this substrate is distinct from such substrates as alumina and the high thermal conductivity metals such as copper which dissipate heat much more rapidly. The dividing line between thermally efficient and thermally inefficient materials is in part dependent on the energy of the laser beam used to pattern the metal.

Figure 2:
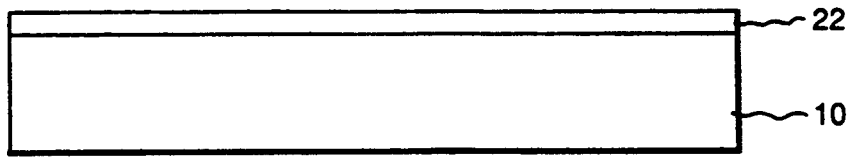
Figure 3:
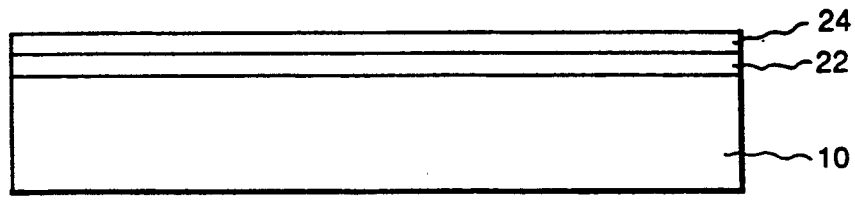
Figure 4:
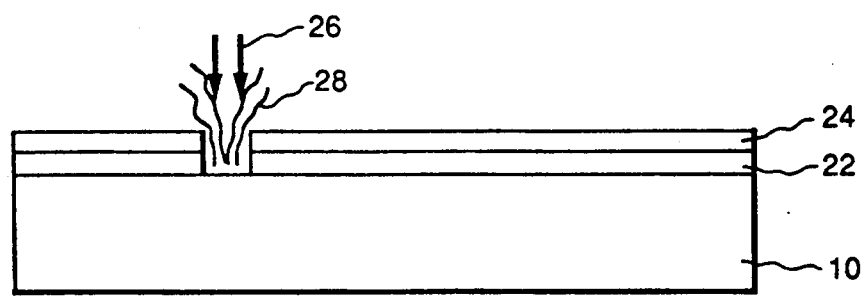

As an initial step in the process of forming the conductor pattern, a first layer of a thermally inefficient metal 22 is formed on the upper surface of the substrate 10 to provide the structure shown in FIG. 2. This metal is preferably titanium, but may instead be chrome, nichrome, nickel, stainless steel, magnesium, manganese and so forth. This metal is deposited on the substrate under vacuum or other non-oxidizing conditions by any appropriate method, such as sputtering, thermal evaporation, chemical vapor deposition and so forth. We prefer to deposit this metal layer by sputtering. This layer is preferably from 500 to 1,000Å thick. Subsequently, a layer 24 of a UV light absorbing metal which is preferably copper but may also be gold, is deposited on top of the layer 22 without breaking the vacuum in the deposition system to provide the structure illustrated in FIG. 3. This copper layer may preferably be deposited to a depth in the range from 500–3,000Å. While thicker layers can be used where higher laser power is available, this thickness is adequate to the purpose, and effective with a laser power of 1–2 watts at 351–363 nm. Other wave lengths may be used with other metals having different absorption spectra. Next, the substrate with its metal coating is mounted in a laser delivery system which is capable of scanning an intense UV light beam across the substrate. We prefer to use an argon ion laser operating at 351 nm, but other frequencies may also be used. The laser is then scanned across the surface of the metal 24 in a pattern which corresponds to the areas in which metal is to be removed as illustrated in FIG. 4. The copper absorbs roughly 60% of the UV light incident thereon and is heated to an ablation temperature. Direct ablation of the titanium itself without an overlying absorbing layer is not effective because titanium reflects about 81% of incident 351 nm light. However, there is sufficient thermal coupling between the copper and the titanium that the laser heating of the copper heats the underlying titanium to an ablation temperature which results in the two metals ablating off the substrate together. We prefer to perform this ablation process in an oxidizing atmosphere. This oxidizing atmosphere may be air, air with additional oxygen added to it, pure oxygen, a chlorine containing atmosphere and so forth. We prefer to use air or air plus oxygen. In this oxidizing atmosphere, the titanium and copper burn as they ablate with a sparkling effect similar to that of Fourth of July sparklers. This sparkling extends substantially above the surface of the metal 24.

With this process, we have obtained line spacings of from 2 to 500 microns, while retaining metal patterns of from 2 to 500 microns wide. Wider or narrower lines and spaces may be produced in accordance with the laser beam size and scanning pattern used for the ablation.

Figure 5:
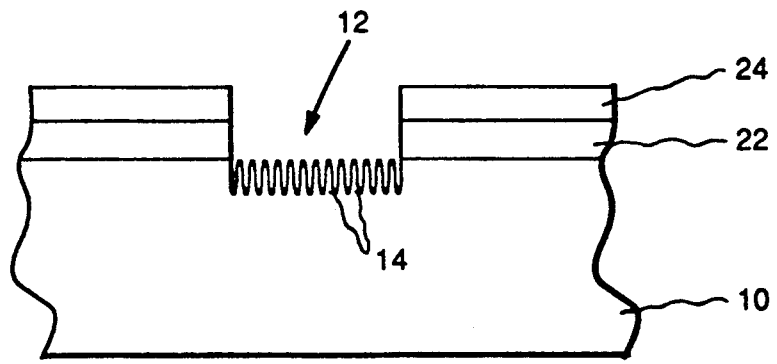

A beneficial side effect of this process where the substrate 10 is a polymer is that the portion of the polymer surface from which the metal is ablated becomes roughened with a surface characteristic which looks much like needles standing on their end. This is illustrated in FIG. 5 where the portion 12 of the substrate surface 10 from which the metal was ablated has needle-like columns 14 extending roughly vertically. In many instances these columns are mushroom shaped with their upper end larger in cross section than their stem or shank. This roughened surface is a substantial advantage in a high density interconnect structure or other structure where a subsequent dielectric layer is later formed over the metal pattern and the exposed portions of the substrate 10. If that subsequent layer is formed by spinning on or spraying on a liquid precursor which is then converted to a solid dielectric in situ, greatly enhanced adhesion results from the infiltration of the subsequent dielectric layer into the gaps between the needles 14 in the roughened surface of the substrate. This provides improved adhesion for a subsequently formed dielectric layer in two ways. First, it provides an increased contact surface area over which chemical adhesion is provided and second, it provides a rough surface which results in mechanical interlocking of the two layers which further increases the strength of the bond between the two layers. This mushroom shape of many of the needles further enhances mechanical interlocking of dielectric layers. As a consequence, use of this process to pattern conductor layers in multilayer structures provides additional benefits in providing a more rugged, more thoroughly bonded structure. Thus, this is an adhesion promoting technique which can be applied to a polymer surface even where none of the deposited metal is to be retained on the polymer and its only function is to enable the roughening of the polymer surface during its ablation. This results in a greatly increased surface area.

The combination of these two metals (copper over titanium) results in much sharper patterning than can be obtained with copper alone even where the substrate on which the copper alone is disposed is a substantially poorer thermal conductor than titanium. It is clear that the two metals interact during ablation in accordance with this invention. We therefore refer to this process as reactive ablation. When copper alone is used, no sparkling results, the line edge definition is much poorer and with a polymer substrate the surface of the polymer remains conductive as a result of some of the copper being left behind. It is believed that the copper which is left behind is actually driven into the surface of the polymer. Thus, use of copper alone results in inferior patterning and inferior surface properties for the resulting structure. As is mentioned above, if titanium alone is used, no ablation takes place at these laser powers because not enough energy is absorbed by the titanium to raise it to an ablation temperature. Thus, the combination of the two metals is necessary for high quality definition of the pattern and that high quality is a result of an unexpected interaction between the two metals during the ablation which results in reactive ablation. This interaction affects the removal of the metals themselves from the substrate, and thus is not a reaction which takes place only in the debris which has already left the surface of the substrate, but also involves the metals while they are still disposed on that surface. Since titanium is highly reactive and in the initial structure has been protected from oxidation by the deposition of the copper layer directly over the titanium without breaking the vacuum in the metal deposition system, it is thought that oxidation is taking place at the exposed edge of the titanium as the laser beam heats the copper which in turn heats the titanium. That oxidation then further heats the titanium resulting in the sparkling effect and the improved definition of the ablation pattern as compared to the pattern when copper alone is present. However, whether this is in fact the actual process is not known at this time. Further, the exact chemical and thermal processes going on is unimportant, since our work establishes that whatever processes are in fact taking place produce the beneficial effects of improved pattern definition, result in a non-conductive surface even on polymer substrates and on polymer substrates produce the needles-on-end surface pattern which greatly increases the exposed surface area of the polymer where the metals have been ablated.

In addition to titanium, chrome used as the first or lower metal layer produces a similar sparkling and improvement in pattern definition. Nichrome, nickel, stainless steel, magnesium, manganese and similar metals which are or contain highly reactive elements will produce similar sparkling and improvement in pattern definition.

Figure 6:
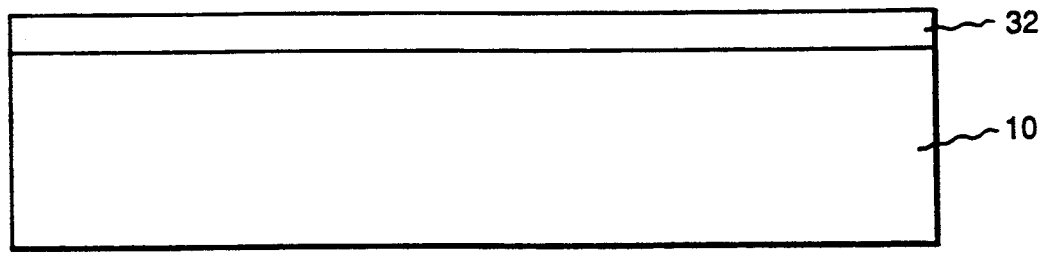
FIGS. 6 and 7 illustrate a sequence of steps in accordance with another embodiment of the invention.
Figure 7:
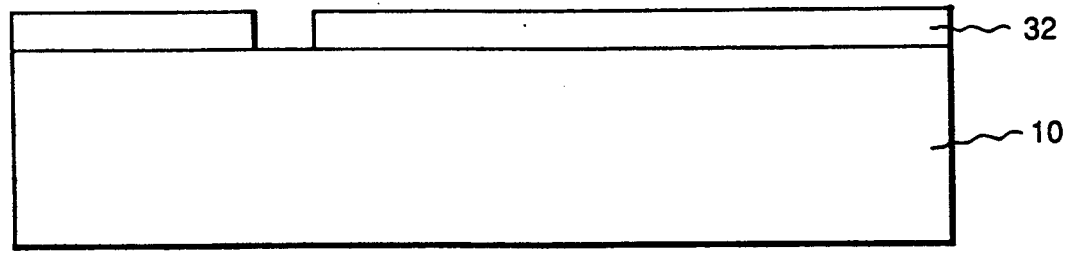
Figure 8:
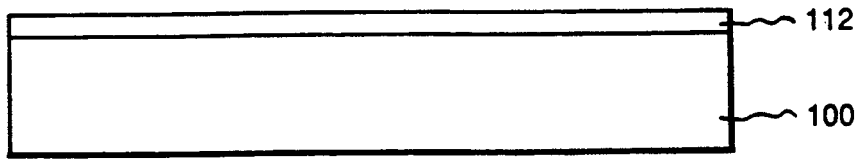
FIGS. 8-11 illustrate a sequence of stages in the fabrication of a pattern in accordance with another embodiment.
Figure 9:
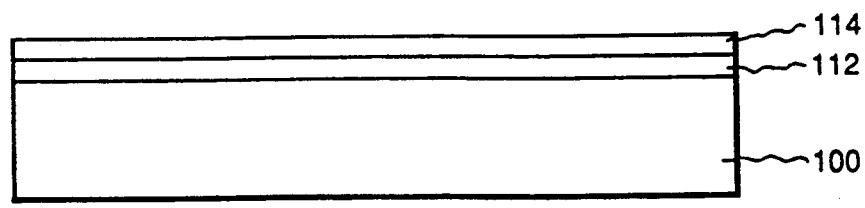
Figure 10:
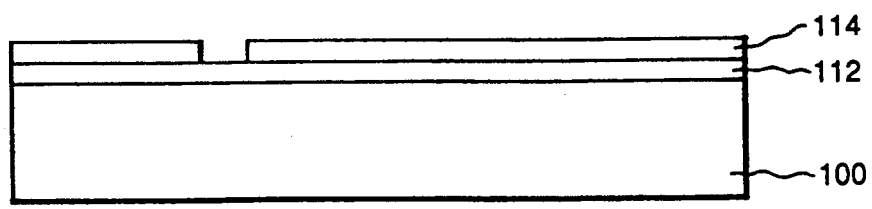
Figure 11:
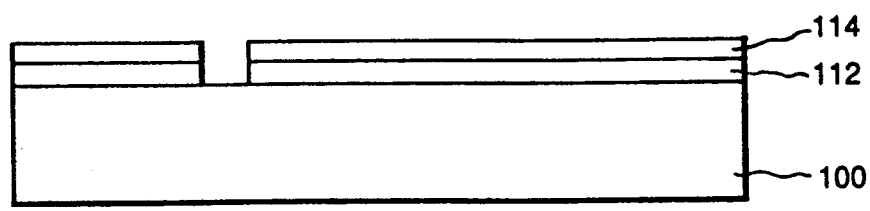

In accordance with another embodiment of the invention, where the UV light absorbing metal will adhere to a desired, thermally inefficient substrate without need for an adhesion promoting layer, a layer 32 of such a UV light absorbing metal may be deposited directly on the substrate 10, as illustrated in FIG. 6. The layer 32 is then patterned by use of laser ablation in the same manner as described above to selectively remove the metal 32 from the surface of the substrate 10 to produce the structure shown schematically in FIG. 7. However, as has been discussed, the resulting pattern is poorer and the substrate surface may remain conductive in the ablated regions where the substrate is a polymer.

Where it is desired to form a metal pattern on a highly thermally conducting substrate such as alumina or a high thermal conductivity metal, the process described above must include the provision of a thermally inefficient layer between the substrate and the ultraviolet UV light absorbing metal in order to enable the laser ablation process to remove the UV light absorbing metal. To this end, a layer 112 of a thermally inefficient metal is vacuum deposited on a thermally conducting substrate 100 to provide the structure illustrated in FIG. 8. This thermally inefficient metal may be titanium, chromium, stainless steel (as a laminated layer) nichrome, magnesium, manganese or other metals or mixtures or alloys of metals which are thermally inefficient and sufficiently reactive. The layer 112 is made thick enough to render its upper surface thermally inefficient. That is, the poor thermal efficiency of the layer 112 insulates an overlying layer from the thermal efficiency of the substrate 100. Thereafter, a layer 114 of UV light absorbing metal is vacuum deposited on the thermally inefficient metal 112 without breaking the vacuum in the deposition apparatus to provide the structure shown in FIG. 9. The upper metal layer 114 protects the lower metal layer 112 from oxidation and other chemical reactions. The metal 114 is then ablated by a laser beam 126 as illustrated in FIG. 10. This removes the UV light absorbing metal 114 in the laser scan pattern and may also remove part of but not all of the thermally inefficient metal 112. At least the lower portion of the thermally inefficient metal remains on the substrate because for a sufficiently thin layer of the thermally inefficient metal, the underlying substrate 100 carries heat away so rapidly that the thermally inefficient layer cannot be heated to an ablation temperature. After the ablative patterning of the UV light absorbing metal layer 114, the retained portions of that upper metal layer may be used as a mask for chemically etching the now exposed portions of the thermally inefficient metal 112 to leave portions 120 of the substrate surface metal-free. After such etching of the exposed portions of layer 112, the structure appears as shown in FIG. 11.

Figure 12:
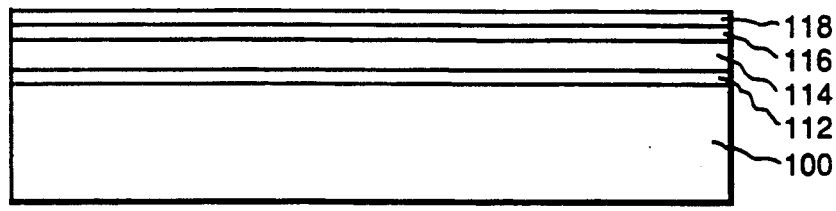
FIGS. 12-16 illustrate stages in another embodiment.
Figure 13:
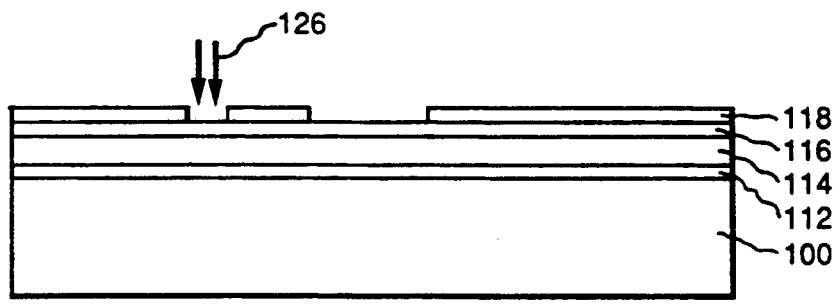
Figure 14:
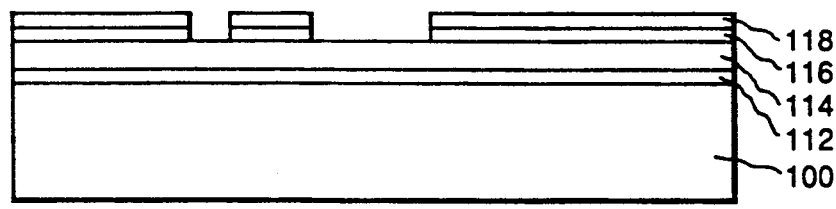
Figure 15:
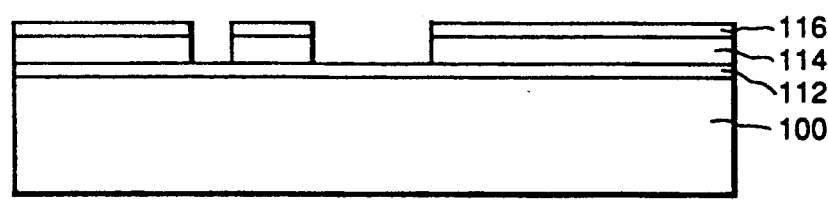
Figure 16:
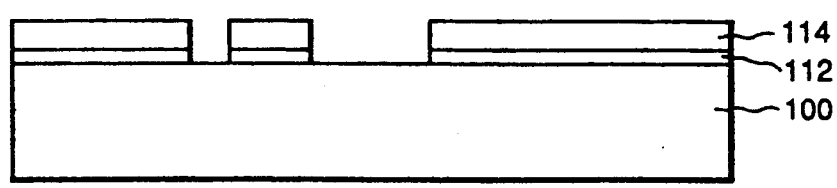

As an alternative to employing the just described two layer metal structure, a four layer metal structure may be formed prior to laser ablation by successively depositing titanium, copper, titanium and copper to provide a structure of the general type shown in FIG. 12. These layers may be ~1000Å thick titanium, ~3000Å of deposited copper on which copper is electroplated to ~3 mm thick, ~500-1000Å thick titanium and ~500-3000Å thick copper, respectively. The uppermost copper layer 118 may then be ablated from the upper surface of the upper titanium layer 116 to leave the copper in the desired pattern for the metallization as shown in FIG. 13. This ablation is generally non-reactive in that no burning or sparkling occurs and none of the titanium appears to be removed during the ablation where the titanium layer is ~500-1000Å thick. However, excellent patterning is obtained. This is believed to be in part a result of the impervious nature of the titanium layer. The now exposed portions of the underlying titanium may then be etched with an HF-based etchant to expose the thick copper layer 114 as shown in FIG. 14. This etchant needs to be one which etches titanium without etching copper. A copper etch then removes the exposed portions of the lower, thick copper layer 14 and the remaining portions of the upper, thin copper layer 118 to provide the structure shown in FIG. 15. A final titanium etch removes the now exposed portions of the lower titanium layer 112 and the portions of the upper titanium layer 116 which protected the copper of the conductor runs during the etching of the thick copper layer 114. This results in the structure shown in FIG. 16.

Figure 17:
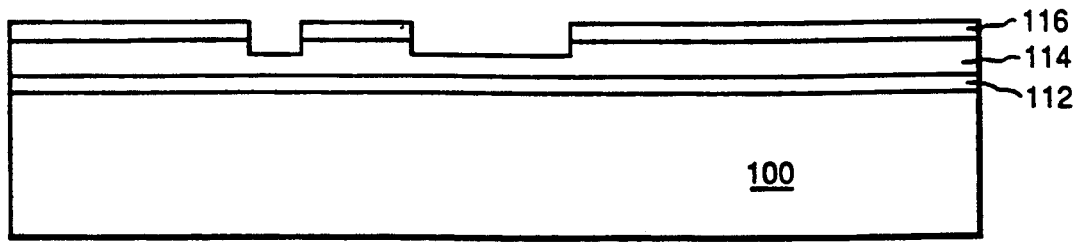
FIGS. 17-19 illustrate stages in an electroplating process.
Figure 18:
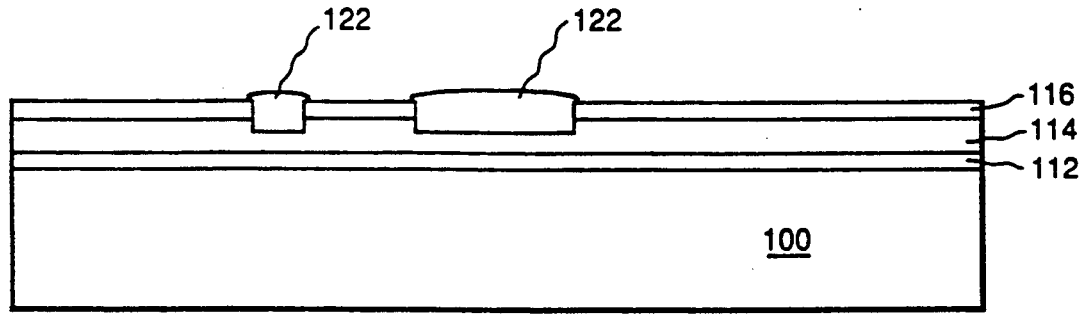
Figure 19:
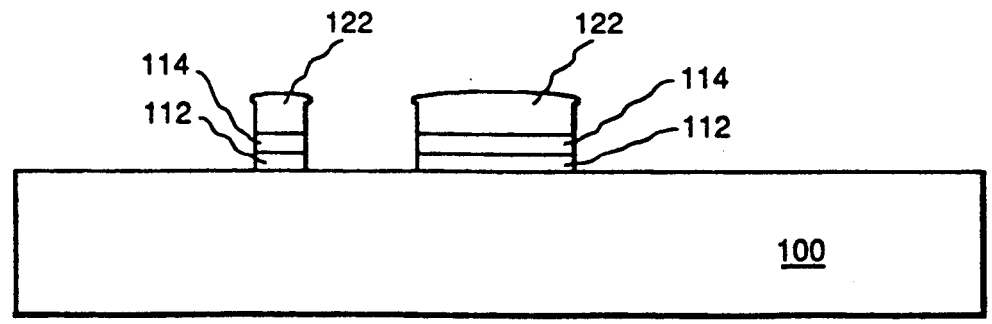

Alternatively, rather than electroplating the first copper layer 114 to thicken it, that copper layer 114 may be left with a thickness of ~6000Å or so and the layers 116 and 18 deposited thereon. The process then follows that described above through the etching of the upper titanium layer 116. Then the retained portions of the upper copper layer 118 are removed from the surface of the titanium by a quick copper etch in ferric chloride which leaves the layer 114 of copper ~3000Å thick as shown in FIG. 17. Titanium forms titanium oxide when exposed to air. As a result, the surface of the upper titanium layer 116 is coated with titanium oxide. The resulting titanium oxide layer is sufficiently electrically insulating to prevent electroplating on the titanium, that is, the titanium oxide coated titanium acts as a resist for electroplating. Thus, this structure may then be electroplated in a copper, gold, chrome or nickel electroplating bath to produce plated conductors having the pattern of the exposed copper 114 without depositing the copper gold, chrome or nickel 122 on the titanium portion of the structure as shown in FIG. 18. This provides an effective method of forming gold, chrome or nickel plating on copper without the problems of photoresist lifting which have been experienced in the prior art. Following this plating operation, the surface titanium layer may be removed in a HF-based etchant, the portions of the lower copper layer 114 which are not protected by plated metal 122 may be removed in a ferric chloride etchant and the then unprotected portions of the lower titanium layer may be removed in a HF-based etchant. The result is the structure illustrated in FIG. 19 in which electroplated copper, gold, chrome or nickel conductors are provided. While this process is highly effective for copper electroplating, its benefits are more pronounced for gold, chromium and nickel electroplating because copper plating baths attack photoresist much more slowly than gold, chromium and nickel electroplating baths do with the result that prior art electroplating of copper has been much more successful than prior art electroplating of gold, chromium and nickel.

Figure 20:
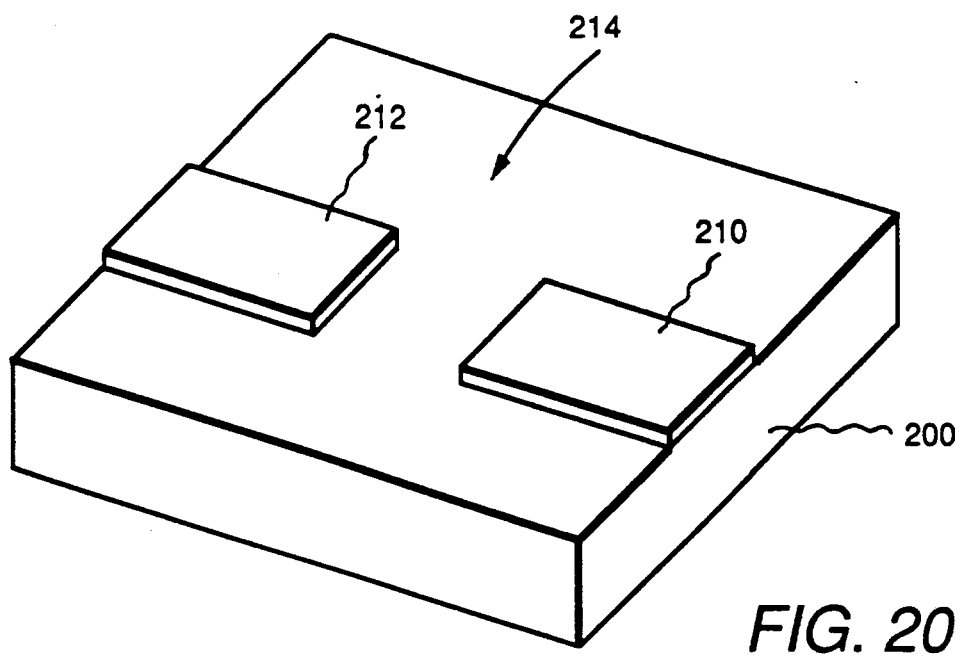
FIGS. 20-22 illustrate circuit repair.

This metal deposition and ablation technique is also suitable for repairing open conductors in printed circuit type structures such as printed circuit boards, VLSI integrated circuits, wafer scale integrated structures, high density interconnect structures and so forth. Such a printed circuit is shown in perspective view in FIG. 20. The substrate 200 may be a single layer of insulating material or may be a multilayer printed circuit structure (including high density interconnect structures) having an insulating upper surface on which the two portions 210 and 212 of an open trace are disposed with an unintended gap 214 therebetween. Where the gap 214 between the conductors 210 and 212 is not discovered until after the formation of a subsequent dielectric layer over those conductors, that dielectric layer needs to be removed at least from the ends of those traces adjacent the gap in order for the metal to-be-deposited to form a good ohmic contact to the conductors 210 and 212.

Figure 21:
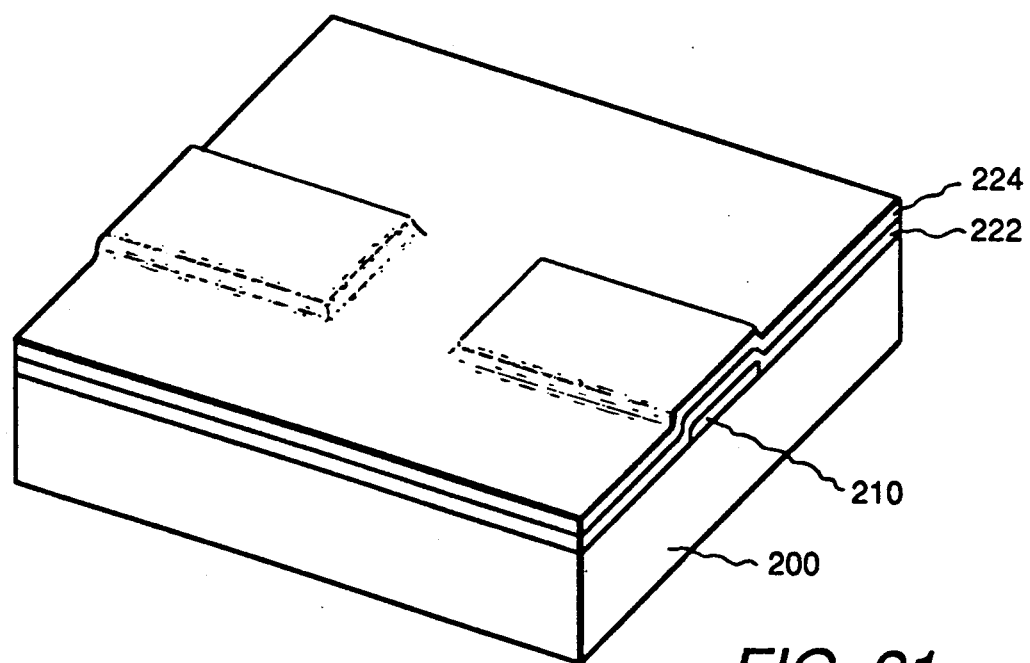
Figure 22:
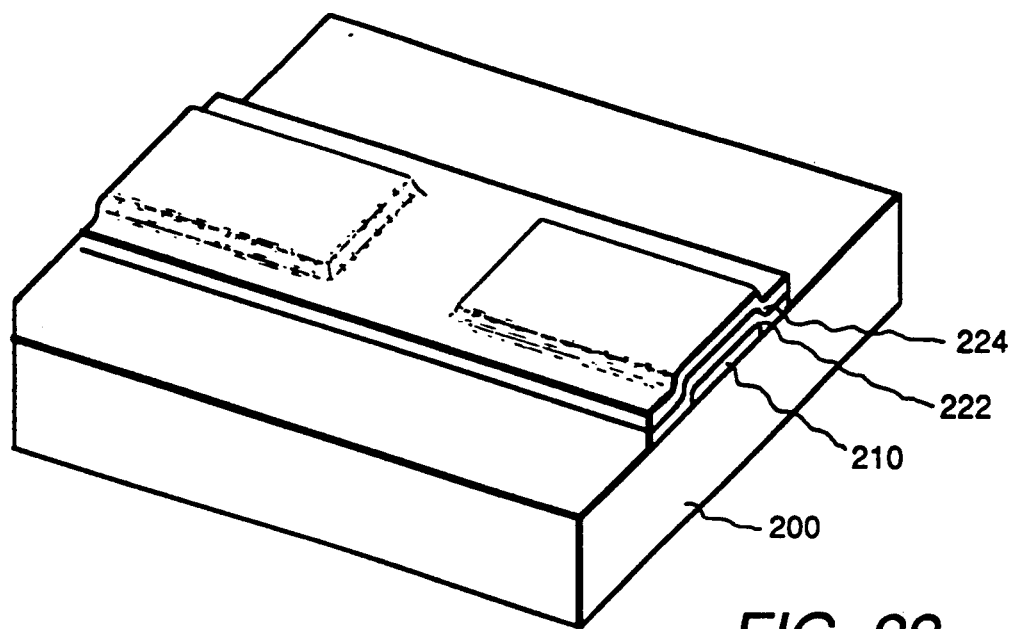

To effect a repair of this open trace, a first layer 222 of a thermally inefficient, reactive metal such as titanium is deposited over the entire upper surface of the substrate 200 and any conductors thereon. Subsequently, a second layer 224 of a UV light absorbing metal such as copper is uniformly deposited over the upper surface. At this stage, as shown in FIG. 21, the entire upper surface of the substrate 200 is conductive. The deposited metals are then laser reactive ablated from those portions of the upper surface of the substrate 200 where conductors are not desired, but without ablating the portions of the deposited metals which bridge the gap 214 between the conductors 210 and 212. The retained portion of the deposited metals in the vicinity of the gap between the conductors 210 and 212 serve as a bridging conductor to close the gap, thereby repairing the structure as shown in FIG. 22.

This same technique can also be used to provide temporary connections for programming during testing or for other purposes. Such temporary connections can then be removed by etching or by further laser ablation.

Figure 23:
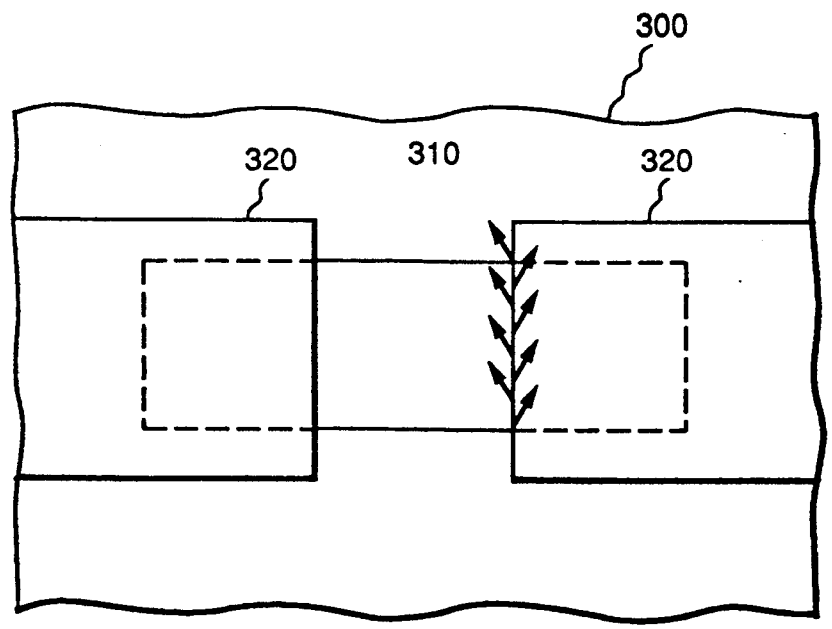
FIG. 23 illustrates trimming of a resistor to adjust its resistance.

This technique is also useful for trimming resistors. In FIG. 23, a resistor 310 is disposed on a substrate 300. A two layer metallization 320 is disposed on top of the resistor material as its contacts. These contacts can be initially patterned by photoresistmasking and etching. These contacts are then laser ablated to increase the length of the current path through the resistor material between the two contacts to thereby increase the resistance exhibited by the resistor. Alternatively, all of the patterning of these contacts can be done by laser ablation.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of producing a desired metal pattern on a surface of a thermally inefficient substrate comprising:
   depositing a layer of a first metal on said substrate;
   depositing a layer of a second, ultraviolet light absorbing metal on said first metal;
   exposing said second metal to intense ultraviolet light in accordance with said desired pattern to reactively ablate said first and second metals from said substrate together.

2. The method recited in claim 1 wherein:
   said first metal is selected from the group consisting of titanium, chromium, magnesium, manganese, nichrome and stainless steel and alloys and mixtures thereof; and
   said second metal is selected from the group consisting of copper and gold and alloys and mixtures thereof.

3. The method recited in claim 2 wherein: said substrate is disposed in an oxidizing atmosphere during said exposing step.

4. The method recited in claim 3 wherein: said first and second metals burn off said substrate together during said exposing step.

5. The method recited in claim 4 wherein:
   said oxidizing atmosphere comprises air.

6. The method recited in claim 3 wherein the step of exposing comprises:
   scanning an ultraviolet laser beam across said substrate.

7. The method recited in claim 3 wherein:
   said oxidizing atmosphere comprises air.

8. The method recited in claim 1 further comprising:
   etching those portions of said substrate from which said first and second metals were ablated.

9. The method recited in claim 1 wherein said substrate is electrically conducting, said first metal is titanium and said method further comprises, after the exposing step, the steps of:
   removing said second metal from said titanium;
   allowing the then exposed titanium to form a surface coating of titanium oxide; and
   electroplating said substrate to build up electroplated metal in those areas from which said metals were ablated without building up electroplated metal on said titanium.

10. The method recited in claim 1 wherein the step of exposing comprises:
    scanning an ultraviolet laser beam across said substrate.

11. A method of increasing the surface area of a polymer comprising:
    depositing a first layer of metal selected from the group consisting of titanium, chromium, nichrome, stainless steel, magnesium and manganese and alloys and mixtures thereof on said polymer;
    depositing a second layer of metal selected from the group consisting of copper and gold and alloys and mixtures thereof on said first layer of metal;
    laser ablating said second and first metal layers together in an oxidizing atmosphere under conditions in which said first layer of metal burns off to leave said polymer with a structured surface.

12. A method of repairing a broken trace in a printed circuit comprising:
    depositing a layer of a first metal on said printed circuit, in ohmic contact with both pieces of said trace and across the gap between them;
    depositing a layer of a second, ultraviolet light absorbing metal on said first metal;
    laser albating said first and second metals from said printed circuit while leaving said metals in ohmic contact with both pieces of aid broken circuit trace and continuous therebetween to leave said first and second metals as a conducting bridge connecting the two pieces of said broken trace.

13. A method of trimming a resistor comprising:
depositing a layer of a first metal on said resistor;
depositing a layer of a second, ultraviolet light absorbing, metal on said first metal;
laser ablating said first and second metals together from said resistor in a pattern to provide said resistor with a desired resistance.

14. A method of producing a metal pattern on a surface of a high thermal conductivity substrate comprising:
depositing a layer of a first thermally inefficient metal on said substrate, said layer being thick enough to render the resulting surface thermally inefficient;
depositing a layer of a second, ultraviolet light absorbing metal on said first metal; exposing said second metal to intense ultraviolet light in the inverse of said pattern to ablate said second metal from said first metal.

15. The method recited in claim 14 wherein:
said first metal is selected from the group consisting of titanium, chromium, magnesium, manganese, nichrome and stainless steel; and said second metal is selected from the group consisting of copper and gold.

16. The method recited in claim 15 wherein:
said substrate is disposed in an oxidizing atmosphere during said exposing step.

17. The method recited in claim 16 wherein:
said oxidizing atmosphere comprises oxygen.

18. The method recited in claim 17 wherein the step of exposing comprises:
scanning an ultraviolet laser beam across said substrate.

19. The method recited in claim 15 further comprising:
etching exposed portions of said first metal with an etchant which does not attack said second metal.

20. The method recited in claim 14 wherein said substrate is electrically conducting, said first metal is titanium and said method further comprises, after the step of exposing, the steps of:

selectively removing said second metal from said titanium;
allowing the then exposed titanium to form a surface coating of titanium oxide; and
electroplating said substrate to build up electroplated metal in those areas from which said metals were ablated without building up electroplated metal on said 21. The method recited in claim 14 wherein the step of exposing comprises:
scanning an ultraviolet laser beam across said substrate.

22. A method of producing a metal pattern on a surface of a high thermal conductivity substrate comprising:
depositing a first layer of a metal on said substrate,
depositing a second layer of a metal on said first layer of metal;
depositing a third layer of a thermally inefficient metal on said second layer of metal, said third thick enough to render the resulting surface thermally inefficient;
depositing a fourth layer of an ultraviolet light absorbing metal on said third layer of metal;
exposing said fourth layer of metal to intense ultraviolet light in the inverse of said pattern to ablate said fourth layer of metal from the surface of said third layer of metal.

23. The method recited in claim 22 further comprising the step of:
etching exposed portions of said third layer of metal with an etchant to which said fourth layer of metal is substantially immune to pattern said third layer of metal.

24. The method recited in claim 23 further comprising the step of:
etching exposed portions of said second layer of metal with an etchant to which said third layer of metal is substantially immune.

25. The method recited in claim 24 further comprising the step of:
etching exposed portions of said first layer of metal with an etchant to which said second layer of metal is substantially immune.

26. The method recited in claim 22 wherein:
said first and third layers comprise titanium; and
said second and fourth layers comprise copper.

* * * * *